US012805347B2

(12) United States Patent
Yan et al.

(10) Patent No.: US 12,805,347 B2
(45) Date of Patent: Nov. 17, 2026

(54) MULTI-CHIP INTERCONNECTION PACKAGE STRUCTURE WITH HEAT DISSIPATION PLATE AND PREPARATION METHOD THEREOF

(71) Applicant: SHENZHEN XIUYUAN ELECTRONIC TECHNOLOGY CO., LTD, Shenzhen (CN)

(72) Inventors: Yingqiang Yan, Guangzhou (CN); Chuan Hu, Guangzhou (CN); Yao Wang, Guangzhou (CN); Wei Zheng, Guangzhou (CN); Zhitao Chen, Guangzhou (CN)

(73) Assignee: SHENZHEN XIUYUAN ELECTRONIC TECHNOLOGY CO., LTD, Shenzhen (CN)

( * ) Notice: Subject to any disclaimer, the term of this patent is extended or adjusted under 35 U.S.C. 154(b) by 927 days.

(21) Appl. No.: 18/112,590

(22) Filed: Feb. 22, 2023

(65) Prior Publication Data

US 2024/0136297 A1 Apr. 25, 2024
US 2024/0234328 A9 Jul. 11, 2024

(30) Foreign Application Priority Data

Oct. 19, 2022 (CN) ......................... 202211277815.5

(51) Int. Cl.
*H10W 70/60* (2026.01)
*H10W 74/01* (2026.01)
(Continued)

(52) U.S. Cl.
CPC ....... *H10W 70/614* (2026.01); *H10W 74/014* (2026.01); *H10W 74/019* (2026.01);
(Continued)

(58) Field of Classification Search
CPC . H10W 70/614; H10W 74/019; H10W 90/00; H10W 74/014; H10W 90/10;
(Continued)

(56) References Cited

U.S. PATENT DOCUMENTS 6,737,750 B1 5/2004 Hoffman
2003/0210533 A1 11/2003 Baek
(Continued)

FOREIGN PATENT DOCUMENTS

CN 2785139 Y 5/2006
CN 106816416 A 6/2017
(Continued)

OTHER PUBLICATIONS

Chinese Office Action (including English translation) issued in App. No. CN202211277815 dated Mar. 1, 2025 (pp. 1-24).

*Primary Examiner* — Jacob Y Choi
*Assistant Examiner* — Neil R Prasad
(74) *Attorney, Agent, or Firm* — Gunther J. Evanina; BUTZEL LONG

(57) ABSTRACT

A multi-chip interconnection package structure with a heat dissipation plate and a preparation method thereof are provided. The multi-chip interconnection package structure with a heat dissipation plate includes a fine circuit layer, at least one die, a heat dissipation plate, a plastic package body, and a package circuit layer, the heat dissipation plate is provided on the fine circuit layer, and is mounted on a side of the die away from the fine circuit layer, the plastic package body wraps the die and the heat dissipation plate, and the package circuit layer is provided on the plastic package body.

13 Claims, 3 Drawing Sheets

100

(51) Int. Cl.

| | |
|---|---|
| ***H10W 90/00*** | (2026.01) |
| *H10W 70/05* | (2026.01) |
| *H10W 72/00* | (2026.01) |
| *H10W 90/10* | (2026.01) |
| *H10W 90/20* | (2026.01) |

(52) U.S. Cl.
CPC .......... *H10W 90/00* (2026.01); *H10W 70/093* (2026.01); *H10W 72/0198* (2026.01); *H10W 72/874* (2026.01); *H10W 90/10* (2026.01); *H10W 90/20* (2026.01); *H10W 90/736* (2026.01)

(58) Field of Classification Search
CPC ............... H10W 70/093; H10W 90/20; H10W 72/0198; H10W 72/874; H10W 90/736
See application file for complete search history.

(56) References Cited

U.S. PATENT DOCUMENTS

| | | | | |
|---|---|---|---|---|
| 2010/0084761 | A1 | 4/2010 | Shinagawa | |
| 2017/0186665 | A1 | 6/2017 | Choudhury | |
| 2017/0207204 | A1* | 7/2017 | Lin ....................... | H10W 90/00 |
| 2020/0357721 | A1* | 11/2020 | Sankman .............. | H10W 40/47 |
| 2020/0373244 | A1* | 11/2020 | Kang .................. | H10W 70/614 |
| 2021/0043532 | A1 | 2/2021 | Yuan | |
| 2022/0028842 | A1* | 1/2022 | Chang ................. | H10W 70/611 |
| 2022/0359358 | A1* | 11/2022 | Kim .................... | H10W 70/685 |

FOREIGN PATENT DOCUMENTS

| | | | |
|---|---|---|---|
| CN | 110875282 | A | 3/2020 |
| CN | 111755350 | A | 10/2020 |
| CN | 114496946 | A | 5/2022 |
| JP | 2004207307 | A | 7/2004 |
| KR | 20040037561 | A | 5/2004 |
| KR | 101450761 | B1 | 10/2014 |

* cited by examiner

MULTI-CHIP INTERCONNECTION PACKAGE STRUCTURE WITH HEAT DISSIPATION PLATE AND PREPARATION METHOD THEREOF

CROSS-REFERENCE TO RELATED APPLICATIONS

The present application claims priority to Chinese Patent Application No. 202211277815.5, filed on Oct. 19, 2022, entitled "Multi-Chip Interconnection Package Structure with Heat Dissipation Plate and Preparation Method Thereof," the contents of which are incorporated herein by reference in its entirety.

TECHNICAL FIELD

The present disclosure relates to the technical field of advanced semiconductor package, in particular to a multi-chip interconnection package structure with a heat dissipation plate and a preparation method thereof.

BACKGROUND ART

The system-in-package requires low power consumption, high performance, multiple functions, and a small volume, wherein multiple chips need to be embedded into a package body, especially chips with large power consumption, and it consumes more power than single chip package, and needs to extract and dissipate heat generated by the chips timely. The conventional packaging technology with good heat dissipation has a large dimension, large circuits, and a low interconnection line density, and cannot meet the requirement of high-density fine interconnection. Further, the conventional high-density fine interconnection technology can realize fine interconnection lines and a high density, and achieve high-density package, but cannot solve the problem of heat generated by a high-power density.

SUMMARY

An objective of the present disclosure includes, for example, providing a multi-chip interconnection package structure with a heat dissipation plate and a preparation method of the multi-chip interconnection package structure with a heat dissipation plate, which can improve the heat dissipation effect of the multi-chip interconnection package structure and meanwhile well meet the requirements of fine interconnection, high-density packaging, and good heat dissipation capability of system packaging.

Embodiments of the present disclosure can be realized as follows.

In a first aspect, the present disclosure provides a multi-chip interconnection package structure with a heat dissipation plate, including: a fine circuit layer; at least one die mounted on the fine circuit layer; a heat dissipation plate, provided on the fine circuit layer and mounted on a side of the at least one die away from the fine circuit layer; a plastic package body, wrapping the at least one die and the heat dissipation plate; a package circuit layer, provided on the plastic package body; and a package circuit layer, provided on the plastic package body or a side of the fine circuit layer away from the at least one die, wherein a non-functional surface of the at least one die is mounted on a mounting portion of the heat dissipation plate, and an insulating material is used to make a functional surface of the at least one die mounted on the fine circuit layer; the insulating material is used to make a support portion of the heat dissipation plate directly adhered onto the fine circuit layer; and the at least one die is electrically connected to the fine circuit layer, and the package circuit layer is electrically connected to the fine circuit layer; at least one first conductive hole is formed in the fine circuit layer, and the at least one first conductive hole and a conductive material therein are directly electrically interconnected with the fine circuit layer and at least one pin pad of the at least one die; the package circuit layer is provided on the plastic package body, and the multi-chip interconnection package structure with a heat dissipation plate further includes a substrate circuit layer, the substrate circuit layer is provided on a side of the fine circuit layer away from the at least one die, and the substrate circuit layer and the fine circuit layer are directly electrically connected to each other.

In an optional embodiment, the heat dissipation plate includes the support portion and the mounting portion that are integrally provided, the mounting portion has at least one sink groove configured to accommodate the at least one die, the mounting portion is mounted on a side surface of the at least one die away from the fine circuit layer, the support portion is mounted on the fine circuit layer, and at least one through hole for allowing a plastic package material to pass therethrough is provided between the mounting portion and the support portion.

In an optional embodiment, a thermally conductive adhesive layer is provided between the mounting portion and the at least one die, and the at least one die is bonded to the mounting portion through the thermally conductive adhesive layer.

In an optional embodiment, the functional surface of the at least one die is provided with at least one pin pad, the at least one pin pad is mounted on the fine circuit layer, the at least one first conductive hole running through to the at least one pin pad or the heat dissipation plate is formed in the fine circuit layer, a conductive material is filled in the at least one first conductive hole, and the substrate circuit layer covers the at least one first conductive hole, and is electrically connected to the at least one pin pad or the heat dissipation plate through the at least one first conductive hole.

In an optional embodiment, the substrate circuit layer includes a substrate wiring layer and a substrate insulation layer, the substrate wiring layer is provided on a side surface of the fine circuit layer away from the at least one die, and is electrically connected to both the fine circuit layer and the at least one first conductive hole, and the substrate insulation layer is provided on a side surface of the fine circuit layer away from the at least one die, and covers the substrate wiring layer.

In an optional embodiment, the fine circuit layer includes a fine wiring layer and a fine insulation layer, the fine insulation layer wraps the fine wiring layer, the at least one die is mounted on a side surface of the fine insulation layer, and the fine wiring layer is exposed on a side surface of the fine insulation layer away from the at least one die, the substrate circuit layer is provided on a side of the fine insulation layer away from the at least one die, and is electrically connected to the fine wiring layer.

In an optional embodiment, the fine circuit layer further includes a base material insulation layer, the base material insulation layer is provided on a side surface of the fine insulation layer away from the at least one die and covers the fine wiring layer, the substrate circuit layer is provided on a side surface of the base material insulation layer away from the at least one die, at least one third conductive hole running through to the fine wiring layer is formed in the base material insulation layer, and the substrate circuit layer is electrically connected to the fine wiring layer through the at least one third conductive hole.

In an optional embodiment, the fine wiring layer has at least one external bonding pad, at least one second conductive hole running through to the external bonding pad is formed in the plastic package body, the at least one second conductive hole is filled with a conductive material, the package circuit layer covers the at least one second conductive hole, and is electrically connected to the external bonding pad through the at least one second conductive hole.

In an optional embodiment, the package circuit layer includes the package wiring layer and the package insulation layer, the package wiring layer is provided on a surface of the plastic package body, and is in contact with the heat dissipation plate, the package wiring layer covers the at least one second conductive hole and is electrically connected to the at least one second conductive hole, and the package insulation layer is provided on a surface of the plastic package body and wraps the package wiring layer.

In an optional embodiment, the substrate circuit layer or the package circuit layer is further provided thereon with at least one solder ball.

In an optional embodiment, the multi-chip interconnection package structure with a heat dissipation plate further includes at least one stacking chip, the at least one stacking chip is mounted on a side of the heat dissipation plate away from the at least one die, and is wrapped in the plastic package body, and the at least one stacking chip is electrically connected to the package circuit layer or the heat dissipation plate.

In an optional embodiment, the package circuit layer is provided on a side of the fine circuit layer away from the at least one die, the multi-chip interconnection package structure with a heat dissipation plate further includes at least one stacking chip, the at least one stacking chip is mounted on a side of the fine circuit layer away from the at least one die, and is wrapped in the package circuit layer, and the at least one stacking chip is electrically connected to the fine circuit layer.

In a second aspect, the present disclosure provides a preparation method of a multi-chip interconnection package structure with a heat dissipation plate, for preparing the multi-chip interconnection package structure with a heat dissipation plate according to any one of the preceding embodiments, wherein the preparation method includes: preparing a fine circuit layer and a heat dissipation plate; mounting a non-functional surface of at least one die on the heat dissipation plate; mounting a functional surface of the at least one die and the heat dissipation plate together on the fine circuit layer; forming, on the fine circuit layer, a plastic package body wrapping the at least one die and the heat dissipation plate; forming a package circuit layer on the plastic package body; forming a substrate circuit layer on a side of the fine circuit layer away from the at least one die; and cutting the substrate circuit layer, the fine circuit layer, the plastic package body, and the package circuit layer along a cutting path, wherein the substrate circuit layer is electrically connected to the fine circuit layer, the at least one die is electrically connected to the substrate circuit layer, and the package circuit layer is electrically connected to the fine circuit layer.

In an optional embodiment, before the step of mounting the at least one die on the fine circuit layer, the preparation method further includes: preparing the fine circuit layer on a substrate.

In an optional embodiment, before the step of forming a substrate circuit layer on a side of the fine circuit layer away from the at least one die, the preparation method further includes: stripping off or thinning the substrate.

In an optional embodiment, before the step of forming on the fine circuit layer a plastic package body wrapping the at least one die and the heat dissipation plate, the preparation method further includes: mounting at least one stacking chip on a side surface of the heat dissipation plate away from the at least one die.

In a third aspect, the present disclosure provides a preparation method of a multi-chip interconnection package structure with a heat dissipation plate, for preparing the multi-chip interconnection package structure with a heat dissipation plate according to any one of the preceding embodiments, wherein the preparation method includes: mounting at least one die on a heat dissipation plate; mounting the heat dissipation plate and the at least one die on a substrate; forming, on the substrate, a plastic package body wrapping the at least one at least one die and the heat dissipation plate; removing the substrate and forming the fine circuit layer on a side of the at least one die; mounting at least one stacking chip on a side of the fine circuit layer away from the at least one die; forming a package circuit layer on a side of the fine circuit layer away from the at least one die, and mounting (placing) at least one ball, wherein the package circuit layer is electrically connected to the fine circuit layer, the at least one die is electrically connected to the fine circuit layer, the at least one stacking chip is electrically connected to the fine circuit layer, and the at least one stacking chip is wrapped in the package circuit layer.

The beneficial effects of the embodiments of the present disclosure include, for example; the multi-chip interconnection package structure with a heat dissipation plate and the preparation method thereof provided in the embodiments of the present disclosure, firstly, the die is mounted on the fine circuit layer, then the heat dissipation plate is provided on the fine circuit layer, with the heat dissipation plate mounted on a side of the die away from the fine circuit layer, then plastic packaging is performed on the fine circuit layer to form the plastic package body wrapping the die and the heat dissipation plate, and the package circuit layer is provided on the plastic package body, wherein the die is electrically connected to the fine circuit layer, and the package circuit layer is electrically connected to the fine circuit layer. Compared with the prior art, in the present disclosure, on the basis of using fine circuit package, by additionally providing the heat dissipation plate and making the heat dissipation plate simultaneously contact the fine circuit layer and the die, heat generated by the die and the fine circuit layer can be rapidly taken away and transferred to the outside, thereby greatly improving the heat dissipation capability of the fine circuit package structure, and well meeting the requirements of fine interconnection, high-density package, and good heat dissipation capability required by system package.

BRIEF DESCRIPTION OF DRAWINGS

In order to more clearly illustrate technical solutions of embodiments of the present disclosure, drawings which need to be used in the embodiments will be introduced briefly below, and it should be understood that the drawings below merely show embodiments of the present disclosure, therefore, they should not be considered as limitation on the scope, and those ordinarily skilled in the art still could obtain other relevant drawings according to these drawings, without using any creative efforts.

Figure 1:
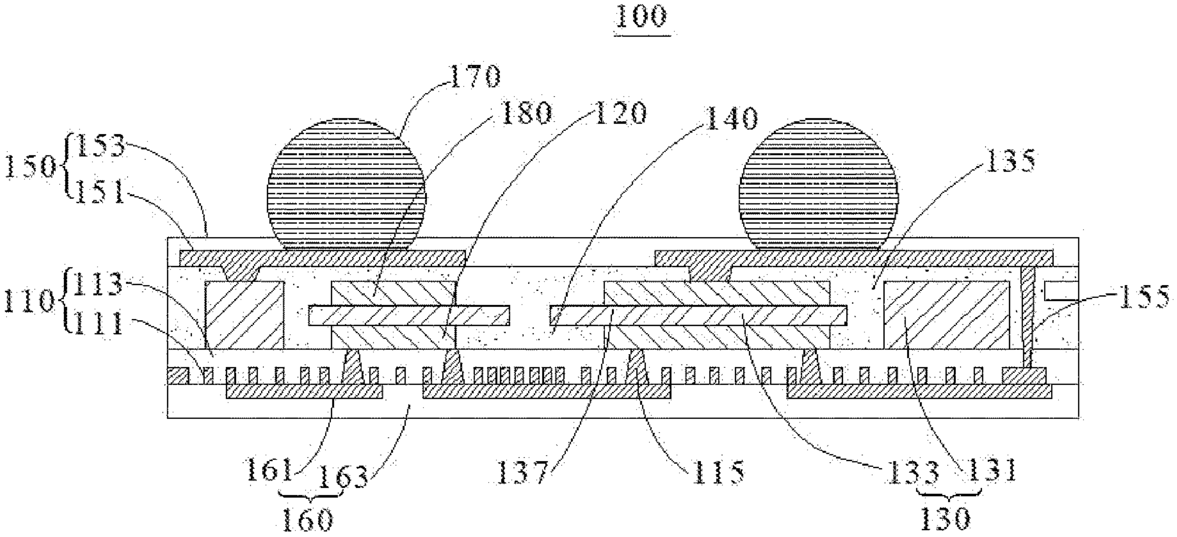
FIG. 1 is a schematic diagram of a multi-chip interconnection package structure with a heat dissipation plate provided in a first embodiment of the present disclosure.

Reference numerals: 100—multi-chip interconnection package structure with a heat dissipation plate; 110—fine circuit layer; 111—fine wiring layer; 113—fine insulation layer; 115—first conductive hole; 117—base material insulation layer; 120—die; 130—heat dissipation plate; 131—support portion; 133 mounting portion; 135—through hole; 137—thermally conductive adhesive layer; 140—plastic package body; 150—package circuit layer; 151—package wiring layer; 153—package insulation layer; 155—second conductive hole; 160—substrate circuit layer; 161—substrate wiring layer; 163—substrate insulation layer; 165—third conductive hole; 170—solder ball; 180—stacking chip; 200—substrate.

DETAILED DESCRIPTION OF EMBODIMENTS

In order to make the objectives, technical solutions, and advantages of the embodiments of the present disclosure clearer, the technical solutions in the embodiments of the present disclosure will be described below clearly and completely in conjunction with the drawings in the embodiments of the present disclosure, and apparently, only some but not all embodiments of the present disclosure are described. Generally, components in the embodiments of the present disclosure, as described and shown in the drawings herein, may be arranged and designed in various different configurations.

Therefore, the detailed description below of the embodiments of the present disclosure provided in the drawings is not intended to limit the scope of protection of the present disclosure, but merely illustrates chosen embodiments of the present disclosure. On the basis of the embodiments of the present disclosure, all of other embodiments, obtained by a person ordinarily skilled in the art without paying creative efforts, should fall within the scope of protection of the present disclosure.

It should be noted that similar reference signs and letters represent similar items in the following drawings, therefore, once a certain item is defined in one drawing, it is not needed to be defined or explained in subsequent drawings.

In the description of the present disclosure, it should be noted that orientation or positional relationships indicated by terms such as "upper", "lower", "inner" and "outer", if appear, are based on orientation or positional relationships as shown in the drawings, or orientation or positional relationships of a product of the present disclosure when being conventionally placed in use, merely for facilitating describing the present disclosure and simplifying the description, rather than indicating or implying that related devices or elements have to be in the specific orientation or configured and operated in a specific orientation, therefore, they should not be construed as limitation to the present disclosure.

Besides, terms such as "first" and "second", if appear, are merely for distinguishing the description, but should not be construed as indicating or implying importance in the relativity.

It should be noted that the features in the embodiments of the present disclosure may be combined with each other without conflict.

First Embodiment

Referring to FIG. 1, the present embodiment provides a multi-chip interconnection package structure 100 with a heat dissipation plate, wherein on the basis of using fine circuit package, by additionally providing the heat dissipation plate 130 and making the heat dissipation plate 130 simultaneously contact the fine circuit layer 110 and the die 120, heat generated by the die 120 and the fine circuit layer 110 can be rapidly taken away and transferred to the outside, thereby greatly improving the heat dissipation capability of the fine circuit package structure, and well meeting the requirements of all of fine interconnection, high-density package, and good heat dissipation capability required by system package.

The multi-chip interconnection package structure 100 with a heat dissipation plate provided in the present embodiment includes the fine circuit layer 110, the die 120, the stacking chip 180, the heat dissipation plate 130, the plastic package body 140, the package circuit layer 150, and the substrate circuit layer 160, wherein the die 120 is mounted on the fine circuit layer 110, the heat dissipation plate 130 is provided on the fine circuit layer 110 and mounted on a side of the die 120 away from the fine circuit layer 110, the plastic package body 140 wraps the die 120 and the heat dissipation plate 130, the package circuit layer 150 is provided on the plastic package body 140, and the substrate circuit layer 160 is provided on a side of the fine circuit layer 110 away from the die 120. In the above, the substrate circuit layer 160 is electrically connected to the fine circuit layer 110, the die 120 is electrically connected to the substrate circuit layer 160, the substrate circuit layer 160 is electrically connected to the fine circuit layer 110, and the package circuit layer 150 is electrically connected to the fine circuit layer 110. The stacking chip 180 is mounted on a side of the heat dissipation plate 130 away from the die 120 and is wrapped in the plastic package body 140, and the stacking chip 180 is electrically connected to the package circuit layer 150 or the heat dissipation plate 130.

In the present embodiment, the dies 120 and the stacking chips 180 are of the same number, and they can be mounted on two side surfaces of the heat dissipation plate 130 in one-to-one correspondence, so that they all use the heat dissipation plate 130 to dissipate heat, and meanwhile, the stacking chip 180 may realize electrical connection with the upper package circuit layer 150.

It should be noted that the heat dissipation plate 130 in the present embodiment includes a support portion 131 and a mounting portion 133 that are integrally provided, wherein the mounting portion 133 has the sink groove for accommodating the die 120, the mounting portion 133 is mounted on a side surface of the die 120 away from the fine circuit layer 110, the support portion 131 is mounted on the fine circuit layer 110, and the through hole 135 for allowing a plastic package material to pass therethrough is provided between the mounting portion 133 and the support portion 131. Specifically, the heat dissipation plate 130 is a metal plate, and in actual preparation, two side surfaces of the metal plate may be grooved to form grooves, the grooves at the two sides are respectively configured to mount the die

120 and the stacking chip 180, and the groove portion (i.e. the portion which is grooved) forms the mounting portion 133, for accommodating the die 120 or the stacking chip 180, a non-grooved portion (i.e. the portion which is not grooved) forms the support portion 131, and the through hole 135 for allowing the plastic package material to pass therethrough during plastic packaging is further provided between the support portion 131 and the mounting portion 133, thus facilitating the plastic package body 140 in wrapping the whole heat dissipation plate 130 therein during plastic packaging.

It should be noted that, the heat dissipation plate 130 here may be partitioned in a vertical direction in a manner of single-sided grooving, and in other preferred embodiments, the partitions may also be formed by double-sided grooving, or mounting may be directly performed without grooving. The structure of the heat dissipation plate 130 is not specifically limited herein, as long as the heat dissipation plate can be attached to the die 120 to realize the heat dissipation.

When preparing the multi-chip interconnection package structure 100 with a heat dissipation plate, the die 120, the heat dissipation plate 130, and the fine circuit layer 110 may be prepared in advance, wherein the fine circuit layer 110 can be formed by directly coating a glue film layer on a carrier plate (support plate) and then wiring, and after the fine circuit layer 110 is formed, the die 120 is flip-mounted on the fine circuit layer 110, and at this time, the die 120 and the fine circuit layer 110 are bonded to each other by an insulating glue, and are not in direct electrical contact with each other.

In the present embodiment, the thermally conductive adhesive layer 137 is provided between the mounting portion 133 and the die 120, and the die 120 is bonded to the mounting portion 133 through the thermally conductive adhesive layer 137. Specifically, the heat dissipation plate 130 and the fine circuit layer 110 mounted with the die 120 may be pressed together using a thermally conductive adhesive material, wherein a non-functional surface of the die 120 is precisely aligned with and attached to the mounting portion 133, and the support portion 131 can be provided on a surface of the fine circuit layer 110, thus playing a supporting role, so that the structural strength of the whole package structure is enhanced.

It should be noted that, in the present embodiment, two dies 120 are provided in the plastic package body 140, and the two dies 120 may have different dimensions, types, and functions, the mounting portion 133 can be simultaneously attached to the non-functional surfaces of the two dies 120, and the two dies 120 are mounted on the fine circuit layer 110 at an interval. In the above, the through hole 135 is further formed in the mounting portion 133, and the through hole 135 is located between the two dies 120, thereby facilitating the plastic package material in flowing into a space between the two dies 120.

In the present embodiment, the plastic package body 140 may be grooved to expose the bonding pad of the stacking chip 180, and the package circuit layer 150 is made to be directly connected to the stacking chip 180 when preparing the package circuit layer 150, or the stacking chip 180 may be connected to the heat dissipation plate 130 in a wire bonding manner when mounting the die, and subsequently the package circuit layer 150 is electrically connected to the heat dissipation plate 130, thus realizing electrical connection of the stacking chip 180.

In the present embodiment, the first conductive hole 115 also may be connected to the heat dissipation plate 130, so that the heat dissipation plate 130 is directly electrically connected to the substrate circuit layer 160. The electrical connection manner among the heat dissipation plate 130, the fine circuit layer 110, the substrate circuit layer 160, the package circuit layer 150, the die 120, and the stacking chip 180 in the present embodiment is not limited herein.

In the present embodiment, a thermally conductive layer is provided on the non-functional surface of each die 120, and a thermally conductive adhesive material is coated on the thermally conductive layer, so that the die 120 is attached to the heat dissipation plate 130. By providing the thermally conductive layer and the thermally conductive adhesive layer 137, heat can be quickly transferred to the heat dissipation plate 130, further improving the heat dissipation effect.

In the present embodiment, after the die 120 and the heat dissipation plate 130 are mounted, the plastic packaging may be performed, and through processes such as transfer mold, compress mold, inject mold, and vacuum lamination, the plastic package material flows through and fills the through hole 135 in the heat dissipation plate 130, so as to completely wrap the die 120, the fine circuit layer 110, and the heat dissipation plate 130. It should be noted that, in the present embodiment, the plastic package body 140 may completely cover the heat dissipation plate 130, and in other preferred embodiments, the plastic package body 140 also may be exposed from a top surface of the heat dissipation plate 130, and the plastic package body 140 and the heat dissipation plate 130 are on the same plane. It is possible that the heat dissipation plate 130 is exposed when performing the plastic packaging, or it is also possible that grinding is performed after completing the plastic packaging, so as to expose the heat dissipation plate 130.

The fine circuit layer 110 includes a fine wiring layer 111 and a fine insulation layer 113, the fine insulation layer 113 wraps the fine wiring layer 111, the die 120 is mounted on a side surface of the fine insulation layer 113, and the fine wiring layer 111 is exposed on a side surface of the fine insulation layer 113 away from the die 120, the substrate circuit layer 160 is provided on a side of the fine insulation layer 113 away from the die 120, and is electrically connected to the fine wiring layer 111. Specifically, the fine wiring can be completed after coating the glue film layer on the carrier plate, to form the fine wiring layer 111, wherein the wiring process thereof is consistent with the conventional fine wiring process, then a layer of insulating material is covered when mounting the die 120, so that the fine insulation layer 113 is formed, serving an isolation function.

Specifically, the carrier plate can be removed or thinned after the plastic packaging is completed, wherein when a process of removing the carrier plate is used, the glue film layer can use a strippable material, e.g. a UV adhesive layer, facilitating the subsequent process of stripping off the carrier plate.

In the present embodiment, a functional surface of the die 120 is provided with the pin pad, the pin pad is mounted on the fine circuit layer 110, the first conductive hole 115 running through to the pin pad or the heat dissipation plate 130 is formed in the fine circuit layer 110, the first conductive hole 115 is filled with a conductive material, and the substrate circuit layer 160 covers the first conductive hole 115, and is electrically connected to the pin pad or the heat dissipation plate 130 through the first conductive hole 115. Specifically, the first conductive hole 115 may be directly formed in the fine insulation layer 113 by means of photolithography or laser punching, so that the pin pad is exposed outside, and then the conductive material is filled in the opening by means of electroplating or printing a conductive paste, so as to form the first conductive hole 115, wherein the first conductive hole 115 may be filled with a copper material, so as to achieve good conductive performance.

In other preferred embodiments of the present disclosure, the first conductive hole 115 also may be provided at a position corresponding to the heat dissipation plate 130, for example, to expose the support portion 131, so that the substrate circuit layer 160 is electrically connected to the heat dissipation plate 130, thus also realizing the electrical connection.

In the present embodiment, the substrate circuit layer 160 includes a substrate wiring layer 161 and a substrate insulation layer 163, the substrate wiring layer 161 is provided on a side surface of the fine circuit layer 110 away from the die 120, and is electrically connected to both the fine circuit layer 110 and the first conductive hole 115, and the substrate insulation layer 163 is provided on a side surface of the fine circuit layer 110 away from the die 120 and covers the substrate wiring layer 161. Specifically, after the first conductive hole 115 is formed, interconnection circuits may be prepared on a surface of the fine insulation layer 113, so as to form the substrate wiring layer 161, the substrate wiring layer 161 is directly connected to the first conductive hole 115, thus realizing the electrical connection, and then a layer of insulating material is covered, forming the substrate insulation layer 163.

In the present embodiment, the fine wiring layer 111 has an external bonding pad, a second conductive hole 155 running through to the external bonding pad is formed in the plastic package body 140, the second conductive hole 155 is filled with a conductive material, and the package circuit layer 150 covers the second conductive hole 155, and is electrically connected to the external bonding pad through the second conductive hole 155. Specifically, after the plastic packaging is completed, interconnection holes may be formed on the surface of the plastic package body 140 by laser punching, so that the external bonding pad is exposed, and then the conductive material is filled. Meanwhile, in the present embodiment, the heat dissipation plate 130 also may be exposed by additional laser punching, and the conductive material is filled, so as to facilitate the electrical contact between the package circuit layer 150 and the heat dissipation plate 130.

In the present embodiment, the package circuit layer 150 includes the package wiring layer 151 and the package insulation layer 153. The package wiring layer 151 is provided on a surface of the plastic package body 140 and contacts the heat dissipation plate 130. The package wiring layer 151 covers the second conductive hole 155 and is electrically connected to the second conductive hole 155, and the package insulation layer 153 is provided on the surface of the plastic package body 140 and wraps the package wiring layer 151. Specifically, the second conductive hole 155 runs through the whole plastic package body 140 and a part of the fine insulation layer 113, so as to successfully expose the external bonding pad of the fine wiring layer 111 outside, and the electrical connection between the fine circuit layer 110 and the package wiring layer 151 is realized after filling the conductive material.

In the present embodiment, the substrate circuit layer 160 includes a substrate wiring layer 161 and a substrate insulation layer 163. The substrate wiring layer 161 is provided on a side surface of the fine circuit layer 110 away from the die 120, and is electrically connected to both the fine circuit layer 110 and the first conductive hole 115. The substrate insulation layer 163 is provided on a side surface of the fine circuit layer 110 away from the die 120 and covers the substrate wiring layer 161. Specifically, after the preparation of the first conductive hole 115 is completed, wiring may be completed on the fine insulation layer 113, so as to form the substrate wiring layer 161, completing bottom interconnection wiring. The substrate wiring layer 161 is electrically connected to the die 120 through the first conductive hole 115.

It should be noted that, in the present embodiment, after the carrier plate is removed, the fine wiring layer 111 is directly exposed on the surface of the fine insulation layer 113, and when preparing the substrate wiring layer 161, the substrate wiring layer 161 may be directly in electrical contact with the fine wiring layer 111, thus realizing that the fine wiring layer 111, the substrate wiring layer 161, and the die 120 are electrically connected into one piece. Certainly, if there is residual glue film layer, a part of the fine wiring layer 111 can be exposed by means of laser punching, so that electrical connection with the fine wiring layer 111 also can be realized when preparing the substrate wiring layer 161.

It should also be noted that in the present embodiment, by preparing the first conductive hole 115 and the second conductive hole 155, the fine wiring layer 111, the substrate wiring layer 161, the package wiring layer 151, and the heat dissipation plate 130 are successfully electrically connected into one piece, thus realizing the electrical connection of the whole device.

In the present embodiment, the solder ball 170 is further provided on the substrate circuit layer 160 or the package circuit layer 150. Specifically, in the present embodiment, ball mounting can be completed on the package circuit layer 150, that is, the package insulation layer 153 is grooved to expose the package wiring layer 151, and then electroless nickel/gold plating and BGA ball mounting are performed at the opening of the package insulation layer 153, thus forming the solder ball 170. In the above, in other preferred embodiments, the ball mounting also can be completed on one side of the substrate circuit layer 160, so that the solder ball 170 is located at the bottom of the substrate circuit layer 160.

In other preferred embodiments of the present disclosure, the BGA ball mounting also may not be performed, and external pins may be mounted on the surface at the opening of the package insulation layer 153, which also can realize the electrical external connection function.

The present embodiment further provides a preparation method of the multi-chip interconnection package structure 100 with a heat dissipation plate, which is used for preparing the multi-chip interconnection package structure 100 with a heat dissipation plate as described in the preceding. The preparation method includes the following steps:

S1: mounting the die 120 on the fine circuit layer 110.

Figure 2:
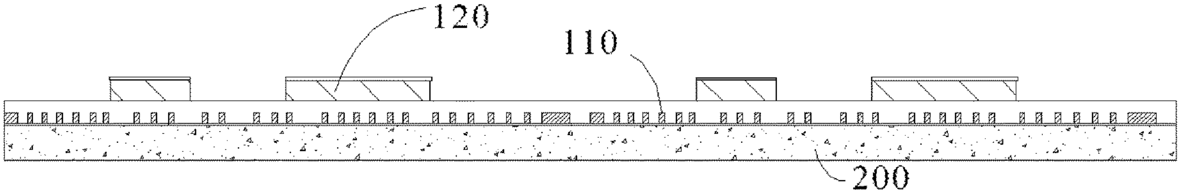
FIG. 2 to FIG. 7 are process flowcharts of a preparation method of the multi-chip interconnection package structure with a heat dissipation plate provided in the first embodiment of the present disclosure.

With reference to FIG. 2, specifically, two dies 120 of different dimensions may be mounted on the fine circuit layer 110 through the insulating material, and before mounting the dies, the fine circuit layer 110, the heat dissipation plate 130, and the die 120 further need to be prepared in advance, and the heat dissipation plate 130 and the die 120 produced on other production lines also can be used.

When preparing the fine circuit layer 110, a substrate 200 may be provided first, wherein the substrate 200 may be a carrier plate, or may also be a base material substrate, then the fine circuit layer 110 is prepared on the substrate 200, i.e., fine wiring is completed on the substrate 200 to form the fine wiring layer 111, and then a layer of insulating material is covered before mounting the die 120, so as to form the fine insulation layer 113, so that the dies 120 can be flip-mounted on the fine circuit layer 110. In the above, if the substrate 200 needs to be stripped off in subsequent steps, a UV adhesive layer may be first coated on the substrate 200, and then fine wiring is completed. The fine wiring process thereof is consistent with the conventional fine wiring process, then a layer of insulating material is covered when mounting the dies 120, so that the fine insulation layer 113 is formed, serving an isolation function.

When preparing the heat dissipation plate 130, first the metal plate may be grooved according to the preset mounting position, so as to partition the metal plate and form the mounting portion 133 and the support portion 131, wherein the mounting portion 133 is of a groove structure configured to accommodate and mount the die 120, and the support portion 131 is configured to be supported on the fine circuit layer 110. Then hollow holes in a vertical direction are formed between the mounting portion 133 and the support portion 131, so as to form the through hole 135 for allowing the plastic package material to pass therethrough during the plastic packaging.

When preparing the die 120, a high power density wafer may be prepared first, wherein after thinning, metal is deposited on the non-functional surface, and the pad bump is prepared on the wafer, then the wafer is thinned, the thermally and electrically conductive layer is covered on the non-functional surface, and finally cutting is performed to obtain a single die 120. In the above, the die 120 may be a power device, a radio frequency chip, a digital chip, a logic chip, a sensor, and the like, of different dimensions, different processes, different functions, and different materials. Specific processes, types, and dimensions etc. of the die 120 are not limited herein.

S2: mounting the heat dissipation plate 130 on a surface of the fine circuit layer 110 and a side surface of the die 120 away from the fine circuit layer 110.

Figure 3:
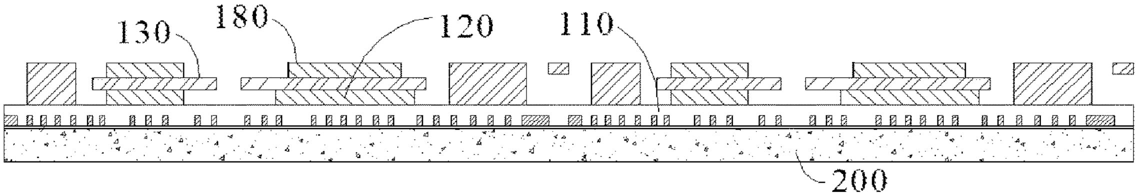

Referring to FIG. 3, specifically, a thermally/electrically conductive adhesive material is used to make the heat dissipation plate 130 and the fine circuit layer 110 mounted with the die 120 pressed together, wherein the non-functional surface of each die 120 is precisely aligned with and attached to the mounting portion 133, wherein the support portion 131 can be supported on a surface of the fine circuit layer 110, thus playing a supporting role, so that the structural strength of the whole package structure is enhanced.

After the heat dissipation plate 130 is mounted on the fine circuit layer 110, the stacking chip 180 can be mounted again on the surface of the mounting area facing away from the die 120, completing double-sided mounting at the mounting area.

For the multi-chip interconnection package structure 100 with a heat dissipation plate and the preparation method thereof provided in the present embodiment, firstly, the die 120 is mounted on the fine circuit layer 110, then the heat dissipation plate 130 is provided on the fine circuit layer 110, with the heat dissipation plate 130 being mounted on a side of the die 120 away from the fine circuit layer 110, then the stacking chip 180 is mounted again, and then plastic packaging is performed on the fine circuit layer 110 to form the plastic package body 140 wrapping the die 120 and the heat dissipation plate 130, the package circuit layer 150 is provided on the plastic package body 140, and finally the substrate circuit layer 160 is provided on a bottom side of the fine circuit layer 110, wherein the substrate circuit layer 160 is electrically connected to the fine circuit layer 110, the die 120 is electrically connected to the substrate circuit layer 160, the substrate circuit layer 160 is electrically connected to the fine circuit layer 110, and the package circuit layer 150 is electrically connected to the fine circuit layer 110. Compared with the prior art, in the present embodiment, on the basis of using the fine circuit package, by adding the heat dissipation plate 130 and making the heat dissipation plate 130 simultaneously contact the fine circuit layer 110, the die 120, and the stacking chip 180, heat generated by the die 120, the stacking chip 180, and the fine circuit layer 110 can be rapidly taken away and transferred to the outside, thereby greatly improving the heat dissipation capability of the fine circuit package structure, and well solving the problem that the system package requires fine interconnection, high-density package, and good heat dissipation capability at the same time. In addition, by means of the package structure of vertical stacking chip 180, the number of stacks can be increased, thus improving the integration degree of the device, and facilitating the miniaturization of the product.

It should be noted that, in step S2, the substrate 200 needs to be turned over and then pressed, and turned over again after the pressing is completed, so that it is convenient to perform step S3.

S3: forming, on the fine circuit layer 110, the plastic package body 140 wrapping the die 120 and the heat dissipation plate 130.

Figure 4:
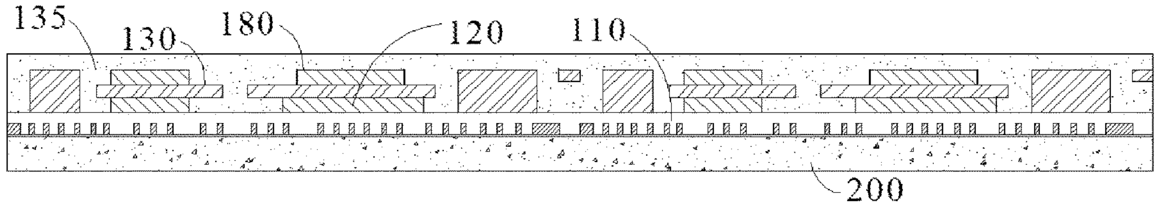

With reference to FIG. 4, the plastic package body 140 meanwhile wraps the stacking chip 180, and after the heat dissipation plate 130 is mounted, the plastic packaging process may be performed, and through processes such as transfer mold, compress mold, inject mold, and vacuum lamination, the plastic package material is made to flow in and fills the through hole 135 on the heat dissipation plate 130, so as to completely wrap the die, the fine circuit layer 110, and the heat dissipation plate 130.

It should be noted that, in the present embodiment, the plastic package body 140 may completely cover the heat dissipation plate 130, and in other preferred embodiments, the plastic package body 140 also may be exposed from a top surface of the heat dissipation plate 130, and the plastic package body 140 and the heat dissipation plate 130 are on the same plane. It is possible to expose the heat dissipation plate 130 when performing the plastic packaging, or it is also possible that grinding is performed after the plastic packaging is completed, so as to expose the heat dissipation plate 130.

S4: forming the package circuit layer 150 on the plastic package body 140.

Figure 5:
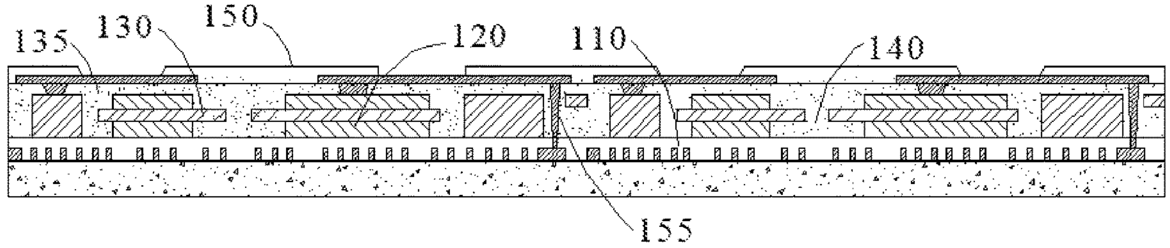

Specifically, referring to FIG. 5, interconnection holes are prepared on the plastic package body 140 using a laser punching process, so that the heat dissipation plate 130 is exposed, meanwhile, holes are punched on the plastic package body 140, to form the second conductive hole 155, so that external bonding pad on the fine circuit layer 110 is exposed, and a conductive material is filled in the second conductive hole 155, so that the second conductive hole 155 is electrically connected to the fine circuit layer 110. After hole punching is completed, the package wiring layer 151 can be prepared on the surface of the plastic package body 140 and the pin pad can be packaged, and then a layer of insulating material is covered again to form the package insulation layer 153, thus completing the preparation of the package circuit layer 150.

It should be noted that, balls need to be mounted on the package circuit layer 150 subsequently, therefore, after step S4 is executed, an opening can be formed on the package insulation layer 153, so that the package wiring layer 151 is exposed, facilitating subsequent ball mounting.

S5: forming the substrate circuit layer 160 on a side of the fine circuit layer 110 away from the die 120.

Figure 6:
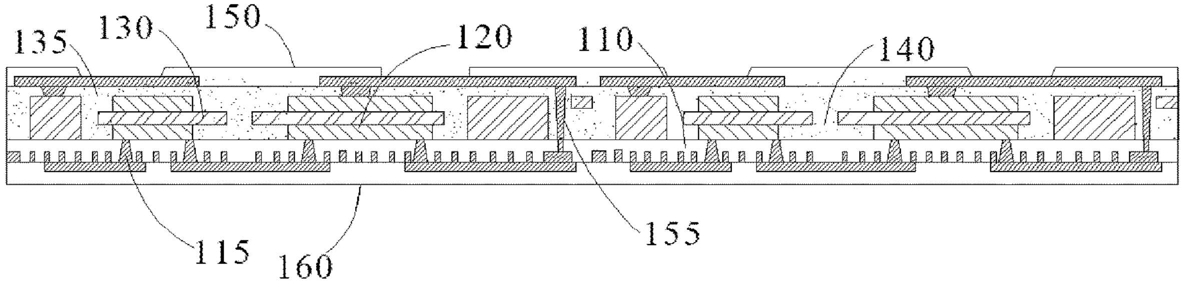

With reference to FIG. 6, specifically, after the preparation of the upper package circuit layer 150 is completed, the substrate 200 can be removed, the UV adhesive layer can be stripped off by means of UV light irradiation so as to complete the stripping of the substrate 200, and after the substrate 200 is stripped off, the fine wiring layer 111 is directly exposed outside the fine insulation layer 113, then interconnection circuits are prepared on the surface of the fine insulation layer 113 to form the substrate wiring layer 161, then a layer of insulating material is covered to form the substrate insulation layer 163, wherein the substrate wiring layer 161 can be directly connected to the fine wiring layer 111, and electrically connected to the pin pad of the die 120, realizing the electrical connection.

In the present embodiment, before preparing the substrate wiring layer 161, the fine insulation layer 113 also can be grooved, to form the first conductive hole 115, so that the pin pad on a functional surface of the die 120 is exposed, and then the conductive material is filled in the first conductive hole 115, so that the first conductive hole 115 is electrically connected to the die 120, and then the substrate wiring layer 161 is prepared, so that the substrate wiring layer 161, the fine wiring layer 111, and the die 120 can be electrically connected into one piece.

In other preferred embodiments of the present disclosure, the first conductive hole 115 also can be directly connected to the heat dissipation plate 130 so that the heat dissipation plate 130, the fine wiring layer 111, and the substrate wiring layer 161 are electrically connected into one piece.

S6: mounting the ball on the package circuit layer 150 to form the solder ball 170.

Figure 7:
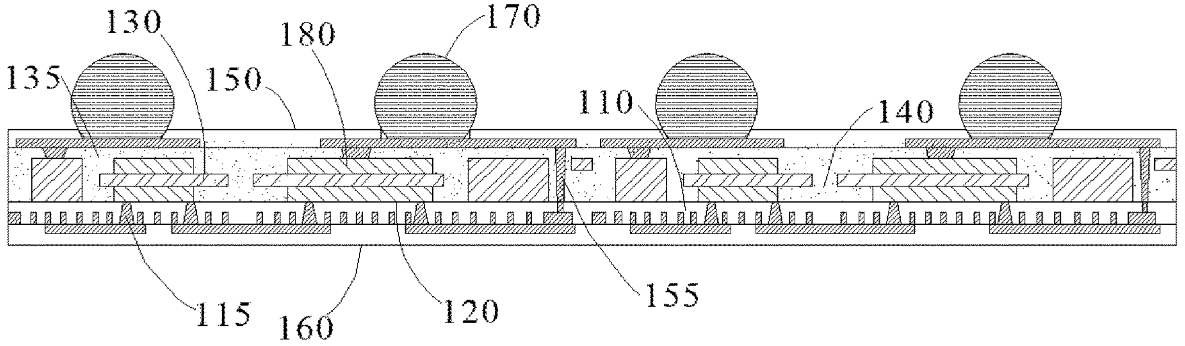

Specifically, referring to FIG. 7, after completing the preparation of the substrate circuit layer 160, the ball can be mounted on the package circuit layer 150, that is, electroless nickel/gold plating and BGA ball mounting are performed at the opening of the package insulation layer 153, so as to form the solder ball 170. Certainly, the BGA ball mounting also may not be performed, and external pins may be mounted on the surface at the opening of the package insulation layer 153, which also can realize the electrical external connection function.

In other preferred embodiments of the present disclosure, the ball also may be mounted on the substrate circuit layer 160, so as to form the solder ball 170. Specifically, the opening may be formed on the substrate insulation layer 163, and electroless nickel/gold plating and BGA ball mounting are performed, so as to form the solder ball 170.

S7: cutting the substrate circuit layer 160, the fine circuit layer 110, the plastic package body 140, and the package circuit layer 150 along the cutting path.

Specifically, with continued reference to FIG. 1, the cutting may be performed along the cutting path prepared in advance, so as to obtain a single product.

In the present embodiment, the substrate circuit layer 160 is electrically connected to the fine circuit layer 110, the die 120 is electrically connected to the substrate circuit layer 160, the substrate circuit layer 160 is electrically connected to the fine circuit layer 110, and the package circuit layer 150 is electrically connected to the fine circuit layer 110.

To sum up, for the multi-chip interconnection package structure 100 with a heat dissipation plate and the preparation method thereof provided in the present embodiment, firstly, the die 120 is mounted on the fine circuit layer 110, then the heat dissipation plate 130 is provided on the fine circuit layer 110, with the heat dissipation plate 130 being mounted on a side of the die 120 away from the fine circuit layer 110, then plastic packaging is performed on the fine circuit layer 110 to form the plastic package body 140 wrapping the die 120 and the heat dissipation plate 130, the package circuit layer 150 is provided on the plastic package body 140, and finally the substrate circuit layer 160 is provided on a bottom side of the fine circuit layer 110, wherein the substrate circuit layer 160 is electrically connected to the fine circuit layer 110, the die 120 is electrically connected to the substrate circuit layer 160, the substrate circuit layer 160 is electrically connected to the fine circuit layer 110, and the package circuit layer 150 is electrically connected to the fine circuit layer 110. Compared with the prior art, in the present embodiment, on the basis of using fine circuit package, by adding the heat dissipation plate 130 and making the heat dissipation plate 130 simultaneously contact the fine circuit layer 110 and the die 120, heat generated by the die 120 and the fine circuit layer 110 can be rapidly taken away and transferred to the outside, thereby greatly improving the heat dissipation capability of the fine circuit package structure, and well meeting the requirements of all fine interconnection, high-density package, and good heat dissipation capability required by system package.

Second Embodiment

Figure 8:
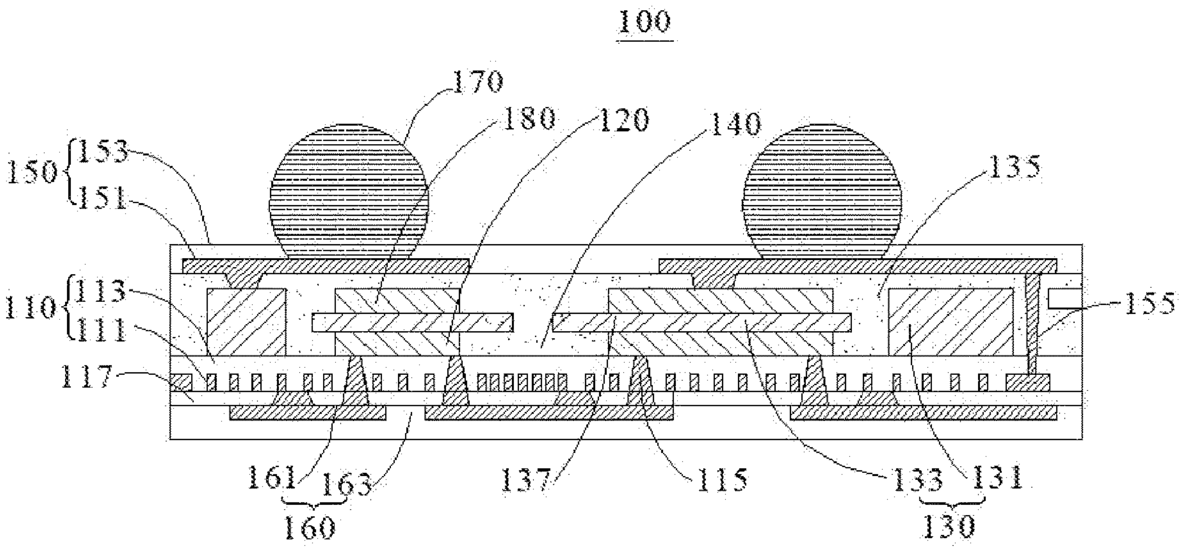
FIG. 8 is a schematic diagram of a multi-chip interconnection package structure with a heat dissipation plate provided in a second embodiment of the present disclosure.

Referring to FIG. 8, the present embodiment provides a multi-chip interconnection package structure 100 with a heat dissipation plate, of which the basic structure and principle as well as the technical effect produced are the same as those in the first embodiment, and for the sake of concise description, reference can be made to corresponding contents in the first embodiment for contents which are not mentioned in the part of the present embodiment.

The present embodiment is different from the first embodiment in the fine circuit layer 110.

In the present embodiment, the multi-chip interconnection package structure 100 with a heat dissipation plate includes the fine circuit layer 110, the die 120, the heat dissipation plate 130, the plastic package body 140, the package circuit layer 150, and the substrate circuit layer 160, wherein the die 120 is mounted on the fine circuit layer 110, the heat dissipation plate 130 is provided on the fine circuit layer 110 and mounted on one side of the die 120 away from the fine circuit layer 110, the plastic package body 140 wraps the die 120 and the heat dissipation plate 130, the package circuit layer 150 is provided on the plastic package body 140, and the substrate circuit layer 160 is provided on one side of the fine circuit layer 110 away from the die 120. In the above, the substrate circuit layer 160 is electrically connected to the fine circuit layer 110, the die 120 is electrically connected to the substrate circuit layer 160, the substrate circuit layer 160 is electrically connected to the fine circuit layer 110, and the package circuit layer 150 is electrically connected to the fine circuit layer 110.

The fine circuit layer 110 includes a fine wiring layer 111, a fine insulation layer 113, and a base material insulation layer 117. The fine insulation layer 113 wraps the fine wiring layer 111. The die 120 is mounted on a side surface of the fine insulation layer 113, and the fine wiring layer 111 is exposed on a side surface of the fine insulation layer 113 away from the die 120. The substrate circuit layer 160 is provided on a side of the fine insulation layer 113 away from the die 120, and is electrically connected to the fine wiring layer 111. The base material insulation layer 117 is provided on a side surface of the fine insulation layer 113 away from the die 120 and covers the fine wiring layer 111. The substrate circuit layer 160 is provided on a side surface of the substrate insulation layer 117 away from the die 120. A third conductive hole 165 running through to the fine wiring layer 111 is prepared on the substrate insulation layer 117, and the substrate circuit layer 160 is electrically connected to the fine wiring layer 111 through the third conductive hole 165. Specifically, the carrier plate can be thinned after the preparation of the package circuit layer 150 is completed, so that a part of the carrier plate and the glue film layer are retained, forming the base material insulation layer 117; alternatively, after the carrier plate is removed, a layer of insulating material is coated again, so as to wrap the fine wiring layer 111 therein to form the base material insulation layer 117.

The present embodiment further provides a preparation method for a multi-chip interconnection package structure 100 with a heat dissipation plate, which is used for preparing the multi-chip interconnection package structure 100 with a heat dissipation plate described in the preceding, wherein the basic steps and principles as well as the technical effects produced by the preparation method are the same as those in the first embodiment. For the sake of concise description, reference can be made to corresponding contents in the first embodiment, for contents which are not mentioned in the part of the present embodiment.

Compared with the first embodiment, the preparation method provided in the present embodiment differs in step S5. Reference can be made to the first embodiment for step S1 to steps S4, S6, and S7.

S5: forming the substrate circuit layer 160 on a side of the fine circuit layer 110 away from the die 120.

Specifically, the carrier plate can be thinned after the preparation of the package circuit layer 150 is completed, so that a part of the carrier plate and the glue film layer are retained, forming the base material insulation layer 117; alternatively, after the carrier plate is removed, a layer of insulating material is coated again, so as to wrap the fine wiring layer 111 therein to form the base material insulation layer 117.

In other preferred embodiments of the present disclosure, a double-sided circuit board prepared in advance also may be directly mounted, wherein an upper side is the fine circuit layer 110, and a lower side is then subjected to wiring, it may be a fine circuit or a non-fine circuit, and interconnection holes can be prepared in advance on the circuit board.

Compared with the first embodiment, the multi-chip interconnection package structure 100 with a heat dissipation plate and the preparation method thereof provided in the present embodiment, by means of retaining a part of the substrate 200, enable the structural strength of the whole package structure to be enhanced, and avoid the problem of residue adhesive generated when stripping off the substrate 200.

Third Embodiment

Figure 9:
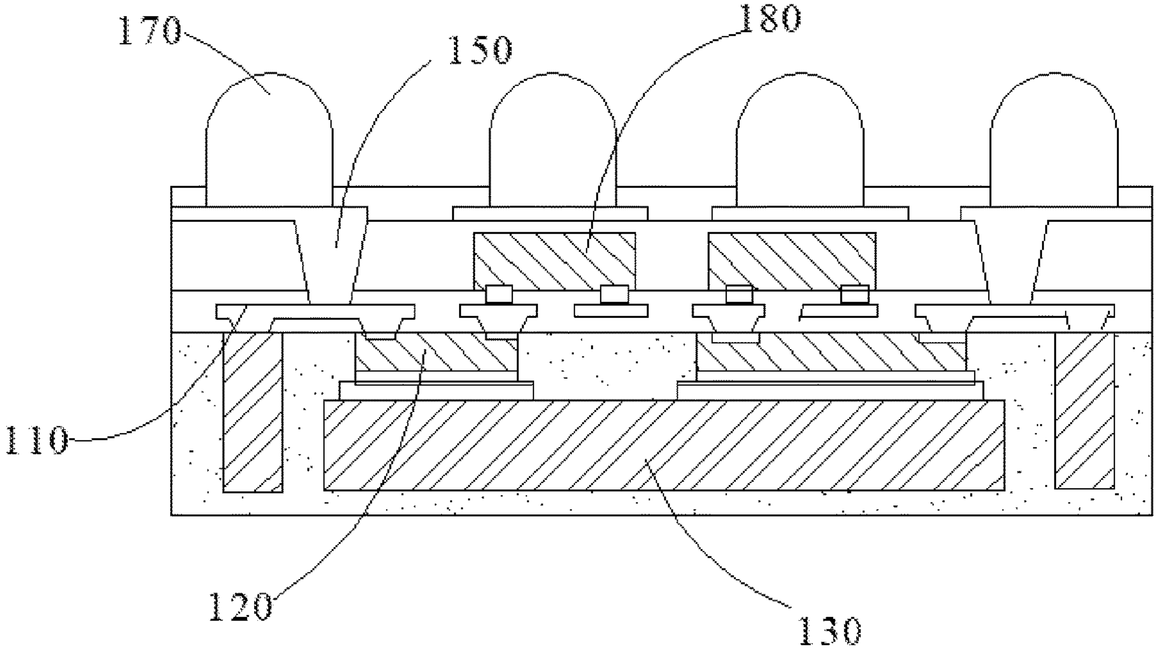
FIG. 9 is a schematic diagram of a multi-chip interconnection package structure with a heat dissipation plate provided in a third embodiment of the present disclosure.

Referring to FIG. 9, the present embodiment provides a multi-chip interconnection package structure 100 with a heat dissipation plate, of which the basic structure and principle as well as the technical effects produced are the same as those in the first embodiment, and for the sake of concise description, reference can be made to corresponding contents in the first embodiment for contents which are not mentioned in the part of the present embodiment.

In the present embodiment, the multi-chip interconnection package structure 100 with a heat dissipation plate includes the fine circuit layer 110, the die 120, the stacking chip 180, the heat dissipation plate 130, the plastic package body 140, the package circuit layer 150, and the substrate circuit layer 160, wherein the die 120 is mounted on the fine circuit layer 110, the heat dissipation plate 130 is provided on the fine circuit layer 110 and mounted on one side of the die 120 away from the fine circuit layer 110, the plastic package body 140 wraps the die 120 and the heat dissipation plate 130, the package circuit layer 150 is provided on the plastic package body 140, and the substrate circuit layer 160 is provided on a side of the fine circuit layer 110 away from the die 120. In the above, the substrate circuit layer 160 is electrically connected to the fine circuit layer 110, the die 120 is electrically connected to the substrate circuit layer 160, the substrate circuit layer 160 is electrically connected to the fine circuit layer 110, and the package circuit layer 150 is electrically connected to the fine circuit layer 110. The package circuit layer 150 is provided on a side of the fine circuit layer 110 away from the die 120, the stacking chip 180 is mounted on a side of the fine circuit layer 110 away from the die 120, and is wrapped in the package circuit layer 150, and the stacking chip 180 is electrically connected to the fine circuit layer 110.

The present embodiment further provides a preparation method of the multi-chip interconnection package structure 100 with a heat dissipation plate, specifically including:

S1: mounting the die 120 on the heat dissipation plate 130.

Specifically, the die 120 is mounted on the heat dissipation plate 130 by an adhesive material and precisely aligned.

S2: mounting the heat dissipation hole 130 and the die 120 on the substrate 200.

Specifically, by a temporary bonding material, the heat dissipation plate 130 mounted with the die 120 is pressed to be combined with the substrate 200.

S3: forming on the substrate 200 a plastic package body 140 wrapping the die 120 and the heat dissipation plate 130.

Specifically, after the heat dissipation plate 130 is mounted, the plastic packaging process may be performed, and through processes such as transfer mold, compress mold, inject mold, and vacuum lamination, the plastic package material is made to flow in and fill the through hole 135 on the heat dissipation plate 130, so as to completely wrap the die, the substrate 200, and the heat dissipation plate 130.

S4: removing the substrate 200 and forming the fine circuit layer 110 on a side of the die 120.

Specifically, the temporary carrier plate and the temporary bonding material are removed, an insulating material is covered on the functional surface side of the die 120 and interconnection holes are prepared, to expose the heat dissipation plate or the pin of the die 120, then a conductive material is filled in the interconnection holes, and the fine circuit layer 110 is prepared and completed on the insulation layer.

S5: mounting the stacking chip 180 on a side of the fine circuit layer 110 away from the die 120.

Specifically, the stacking chip 180 is flip-mounted on the fine circuit layer, wherein the stacking chip may be a chip requiring cavity protection, such as a filter chip, a microfluidic chip.

S6: forming the package circuit layer 150 on a side of the fine circuit layer 110 away from the die 120, and mounting the ball.

Specifically, after completing the mounting of the stacking chip 180, the stacking chip 180 can be wrapped by a plastic packaging material, and then the wiring and ball mounting actions are completed on the plastic packaging material, forming the package circuit layer 150 and the solder ball 170.

The above-mentioned are merely specific embodiments of the present disclosure, but the scope of protection of the present disclosure is not limited thereto, and variations or substitutions, that can be readily envisaged by any technician familiar with the present technical field within the technical scope disclosed in the present disclosure, shall be covered in the scope of protection of the present disclosure. Therefore, the scope of protection of the present disclosure should be determined by the scope of protection of the claims.

What is claimed is:

1. A multi-chip interconnection package structure with a heat dissipation plate, comprising:

a fine circuit layer prepared in advance;

at least one die mounted on the fine circuit layer;

a heat dissipation plate, provided on the fine circuit layer and mounted on a side of the at least one die away from the fine circuit layer, wherein the heat dissipation plate comprises a support portion and a mounting portion that are integrally provided, the mounting portion has at least one sink groove configured to accommodate the at least one die, the mounting portion is mounted on a side surface of the at least one die away from the fine circuit layer, the support portion is mounted on the fine circuit layer, and at least one through hole configured for allowing a plastic package material to pass therethrough is provided between the mounting portion and the support portion;

a plastic package body, wrapping the at least one die and the heat dissipation plate; and a package circuit layer, provided on the plastic package body or a side of the fine circuit layer away from the at least one die, wherein a non-functional surface of the at least one die is mounted on the mounting portion of the heat dissipation plate, and an insulating material is used to make a functional surface of the at least one die mounted on the fine circuit layer; the insulating material is used to make a support portion of the heat dissipation plate directly adhered onto the fine circuit layer; the at least one die is electrically connected to the fine circuit layer, and the package circuit layer is electrically connected to the fine circuit layer; and at least one first conductive hole is formed in the fine circuit layer, and direct electrical interconnection between the fine circuit layer and at least one pin pad of the at least one die is realized through a conductive material in the at least one first conductive hole, wherein the functional surface of the at least one die is provided with the at least one pin pad, the at least one pin pad is mounted on the fine circuit layer, the fine circuit layer is formed with the at least one first conductive hole running through to the at least one pin pad or the heat dissipation plate, the at least one first conductive hole is filled with a conductive material to realize interconnection between the at least one die and the fine circuit layer, the multi-chip interconnection package structure with a heat dissipation plate further comprises a substrate circuit layer, the substrate circuit layer covers the at least one first conductive hole, and is electrically connected to the at least one pin pad or the heat dissipation plate through the at least one first conductive hole, wherein the fine circuit layer comprises a fine wiring layer and a fine insulation layer, the fine insulation layer wraps the fine wiring layer, the at least one die is mounted on a side surface of the fine insulation layer, and the fine wiring layer is exposed on a side surface of the fine insulation layer away from the at least one die, and the substrate circuit layer is provided on a side of the fine insulation layer away from the at least one die, and is electrically connected to the fine wiring layer, wherein the fine wiring layer has at least one external bonding pad, the plastic package body is formed with at least one second conductive hole running through to the external bonding pad, the at least one second conductive hole is filled with a conductive material, and the package circuit layer covers the at least one second conductive hole, and is electrically connected to the at least one external bonding pad through the at least one second conductive hole, wherein the multi-chip interconnection package structure with a heat dissipation plate further comprises at least one stacking chip, a non-functional surface of the at least one stacking chip is mounted on a side of the heat dissipation plate away from the at least one die, and is wrapped in the plastic package body, and the at least one stacking chip is electrically connected to the at least one package circuit layer or the heat dissipation plate through the at least one second conductive hole.

2. The multi-chip interconnection package structure with a heat dissipation plate according to claim 1, wherein a thermally conductive adhesive layer is provided between the mounting portion and the at least one die, and the at least one die is bonded to the mounting portion through the thermally conductive adhesive layer.

3. The multi-chip interconnection package structure with a heat dissipation plate according to claim 1, wherein the substrate circuit layer comprises a substrate wiring layer and a substrate insulation layer, the substrate wiring layer is provided on a side surface of the fine circuit layer away from the at least one die, and is electrically connected to both the fine circuit layer and/or the at least one first conductive hole, and the substrate insulation layer is provided on the side surface of the fine circuit layer away from the at least one die, and covers the substrate wiring layer.

4. The multi-chip interconnection package structure with a heat dissipation plate according to claim 1, wherein the fine circuit layer further comprises a base material insulation layer, the base material insulation layer is provided on the side surface of the fine insulation layer away from the at least one die and covers the fine wiring layer, the substrate circuit layer is provided on a side surface of the base material insulation layer away from the at least one die, the base material insulation layer is formed with at least one third conductive hole running through to the fine wiring layer and/or the substrate circuit layer, and the substrate circuit layer is electrically connected to the fine wiring layer through the at least one third conductive hole.

5. The multi-chip interconnection package structure with a heat dissipation plate according to claim 1, wherein the package circuit layer comprises a package wiring layer and a package insulation layer, the package wiring layer is provided on a surface of the plastic package body, the package wiring layer covers the at least one second conductive hole, and is electrically connected to the at least one second conductive hole, and/or in electrical contact with the heat dissipation plate, and the package insulation layer is provided on a surface of the plastic package body and wraps the package wiring layer.

6. The multi-chip interconnection package structure with a heat dissipation plate according to claim 1, wherein at least one solder ball is further provided on the substrate circuit layer or the package circuit layer.

7. The multi-chip interconnection package structure with a heat dissipation plate according to claim 1, wherein the package circuit layer is provided on the side of the fine circuit layer away from the at least one die, the at least one stacking chip is mounted on the side of the fine circuit layer away from the at least one die, and is wrapped in the package circuit layer, and the at least one stacking chip is electrically connected to the fine circuit layer.

8. A preparation method of a multi-chip interconnection package structure with a heat dissipation plate, for preparing the multi-chip interconnection package structure with a heat dissipation plate according to claim 1, wherein the preparation method comprises steps of:

preparing a fine circuit layer and a heat dissipation plate;

mounting a non-functional surface of at least one die on the heat dissipation plate;

mounting a functional surface of the at least one die and the heat dissipation plate together on the fine circuit layer;

forming a plastic package body wrapping the at least one die and the heat dissipation plate on the fine circuit layer;

preparing at least one first interconnection hole on an insulating material of the fine circuit layer, and filling a conductive material;

forming a substrate circuit layer and/or packaging at least one pin pad on a side of the fine circuit layer and the first conductive hole away from the die;

forming, on the plastic package body, at least one second conductive hole and at least one third conductive hole running through the plastic package body, and filling a conductive material;

forming a package circuit layer and/or packaging the at least one pin pad on the plastic package body, the at least one second conductive hole and the at least one third conductive hole, wherein the conductive holes are electrically connected to the package circuit layer;

preparing and packaging an external bump; and cutting the substrate circuit layer, the fine circuit layer, the plastic package body, and the package circuit layer along a cutting path, wherein the substrate circuit layer is electrically connected to the fine circuit layer, the at least one die is electrically connected to the fine circuit layer and/or the substrate circuit layer, and the package circuit layer is electrically connected to the fine circuit layer.

9. The preparation method of a multi-chip interconnection package structure with a heat dissipation plate according to claim 8, wherein before the step of mounting the at least one die on the fine circuit layer, the preparation method further comprises:

coating a strippable adhesive material on a temporary carrier plate, and preparing the fine circuit layer on the strippable adhesive material; or preparing the fine circuit layer on a substrate material.

10. The preparation method of a multi-chip interconnection package structure with a heat dissipation plate according to claim 9, wherein before the step of forming a substrate circuit layer on a side of the fine circuit layer away from the at least one die, the preparation method further comprises:

stripping off the temporary carrier plate and the strippable adhesive material; or thinning the substrate material.

11. The preparation method of a multi-chip interconnection package structure with a heat dissipation plate according to claim 8, wherein before the step of forming on the fine circuit layer a plastic package body wrapping the at least one die and the heat dissipation plate, the preparation method further comprises:

mounting at least one stacking chip on a side surface of the heat dissipation plate away from the at least one die.

12. A preparation method of a multi-chip interconnection package structure with a heat dissipation plate, for preparing the multi-chip interconnection package structure with a heat dissipation plate according to claim 1, wherein the preparation method comprises:

preparing a fine circuit layer and a heat dissipation plate;

mounting a non-functional surface of at least one die on the heat dissipation plate;

mounting the heat dissipation plate and a functional surface of the at least one die together on a substrate;

forming, on the substrate, a plastic package body wrapping the at least one die and the heat dissipation plate;

removing the substrate and forming the fine circuit layer on a side of the at least one die;

mounting at least one stacking chip on a side of the fine circuit layer away from the at least one die;

forming, at a layer of the fine circuit layer and the at least one stacking chip, a second plastic package body wrapping the at least one stacking chip and the fine circuit layer;

preparing at least one conductive hole running through the second plastic package body, to expose a fine interconnection circuit and/or at least one pin pad of the at least one stacking chip, the at least one conductive hole being filled with a conductive material; and forming a package circuit layer on a side of the fine circuit layer away from the at least one die, and mounting at least one ball, wherein the package circuit layer is electrically connected to the fine circuit layer, the at least one die is electrically connected to the fine circuit layer, the at least one stacking chip is electrically connected to the fine circuit layer, and/or the at least one stacking chip is electrically connected to the package circuit layer.

13. The multi-chip interconnection package structure with a heat dissipation plate according to claim 2, wherein the package circuit layer is provided on the side of the fine circuit layer away from the at least one die, the at least one stacking chip is mounted on the side of the fine circuit layer away from the at least one die, and is wrapped in the package circuit layer, and the at least one stacking chip is electrically connected to the fine circuit layer.

* * * * *